(12) United States Patent
Dang et al.

(10) Patent No.: US 7,535,239 B1
(45) Date of Patent: May 19, 2009

(54) PROBE CARD CONFIGURED FOR INTERCHANGEABLE HEADS

(75) Inventors: Elvin P. Dang, San Jose, CA (US); Mohsen Hossein Mardi, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/639,627

(22) Filed: Dec. 14, 2006

(51) Int. Cl.
*G01R 31/02* (2006.01)

(52) U.S. Cl. ...................................... 324/754
(58) Field of Classification Search .......... 324/754–765
See application file for complete search history.

(56) References Cited

U.S. PATENT DOCUMENTS

| | | | | |
|---|---|---|---|---|
| 5,477,160 | A * | 12/1995 | Love ......................... | 324/755 |
| 6,300,780 | B1 * | 10/2001 | Beaman et al. ............ | 324/754 |
| 6,300,786 | B1 * | 10/2001 | Doherty et al. ............ | 324/765 |
| 6,566,150 | B2 * | 5/2003 | Kohno et al. .................. | 438/14 |
| 6,756,797 | B2 * | 6/2004 | Brandorff et al. ........... | 324/754 |
| 6,784,678 | B2 * | 8/2004 | Pietzschmann ............. | 324/758 |
| 6,897,666 | B2 * | 5/2005 | Swettlen et al. ............ | 324/754 |
| 7,148,716 | B2 * | 12/2006 | Schuette et al. ............ | 324/765 |
| 7,157,923 | B2 * | 1/2007 | Schneider et al. .......... | 324/754 |
| 7,279,919 | B2 * | 10/2007 | Volkerink et al. .......... | 324/765 |
| 7,282,933 | B2 * | 10/2007 | Henson et al. ............. | 324/754 |
| 7,323,899 | B2 * | 1/2008 | Schuette et al. ............ | 324/765 |
| 2006/0250150 | A1 * | 11/2006 | Tunaboylu et al. ......... | 324/754 |
| 2007/0152688 | A1 * | 7/2007 | Kim et al. .................... | 324/754 |

* cited by examiner

*Primary Examiner*—Ha Tran T Nguyen
*Assistant Examiner*—Joshua Benitez
(74) *Attorney, Agent, or Firm*—Robert M. Brush; LeRoy D. Maunu; Lois D. Cartier

(57) ABSTRACT

A probe card configured for interchangeable heads. In one example, a probe card includes a probe card circuit board and a substrate. The substrate includes a first interface coupled to the probe card circuit board and a second interface having a plurality of die patterns. The plurality of die patterns are arranged with respect to the substrate in a plurality of probe pin configurations for a respective plurality of probe heads.

19 Claims, 2 Drawing Sheets

PROBE CARD CONFIGURED FOR INTERCHANGEABLE HEADS

FIELD OF THE INVENTION

One or more aspects of the present invention relate generally to testing of semiconductor devices and, more particularly, to a probe card configured for interchangeable heads.

BACKGROUND OF THE INVENTION

During the manufacture of integrated circuits, certain substrate, device, and processing defects inevitably lead some of the integrated circuit dice on a wafer to be "bad" (i.e., not fully functional). Because of the high cost of cutting integrated circuit wafers into individual dice, packaging the dice, and testing the packaged integrated circuits, integrated circuit dice are typically tested before being mounted on the supporting substrate. During integrated circuit wafer level testing, individual integrated circuit dice are tested by temporarily contacting individual power and signal input/output (I/O) connections, such as solder bumps or die pads, with probes mounted to a probe card assembly of a tester.

Conventional probe cards are classified as either horizontal type (cantilever type) or vertical type. The horizontal type probe card is not suitable for simultaneous testing of multiple dice on a wafer. In contrast, the vertical type probe card is typically used to test multiple dice on a wafer simultaneously. As used herein, vertical probe cards used to test multiple dice on a wafer are referred to as "multi-site probe cards." A vertical probe card typically includes vertical probe pins and a multi-layer interconnection substrate, such as a multi-layer ceramic (MLC) substrate or a multi-layer organic (MLO) substrate. Design and fabrication of an MLC/MLO substrate, however, can be a lengthy and costly process.

For example, a given integrated circuit device may be fabricated at two or more foundries. The design of the interconnection substrate for a multi-site vertical probe card must account for the distance between integrated circuit dice on the wafer, referred to as the "scribe width." Different foundries may produce wafers with different scribe widths between the dice. Thus, one probe card having an interconnection substrate designed with a fixed scribe width cannot be used across such foundries. This results in the design and manufacture of two or more interconnection substrates (e.g., one for each foundry), which further increases costs and lead time. Accordingly, there exists a need in the art for a probe card having a common interconnection substrate that can be used across multiple foundries.

SUMMARY OF THE INVENTION

A probe card configured for interchangeable heads is described. In one embodiment, a probe card includes a probe card circuit board and a substrate. The substrate includes a first interface coupled to the probe card circuit board and a second interface having a plurality of die patterns. The plurality of die patterns are arranged with respect to the substrate in a plurality of probe pin configurations for a respective plurality of probe heads.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
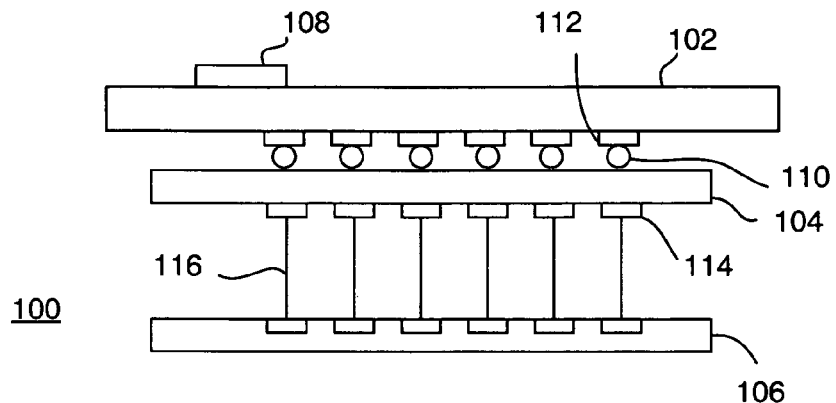
FIG. 1 is a cross-sectional view of a probe card constructed in accordance with one or more aspects of the invention.

FIG. 1 is a cross-sectional view of a probe card 100 constructed in accordance with one or more aspects of the invention. The probe card 100 includes a printed circuit board (PCB) 102, an interposing substrate 104, and a probe head 106. Generally, the probe card 100 is of the vertical type and is configured to test multiple integrated circuit dice simultaneously (e.g., a multi-site probe card). The PCB 102 (also referred to as a probe card circuit board) includes conductive traces 108, which are connected in a test circuit relationship to integrated circuit test equipment (not shown). In practice, the conductive traces 108 (on the surface of the PCB 102 as shown and/or within the PCB layers) lead to other contacts, e.g., pogo pads, on the PCB 102 to which the external test equipment leads are connected to implement a prescribed test.

The interposing substrate 104 includes a first interface coupled to the PCB 102 ("PCB interface") and a second interface coupled to the probe head 106 ("probe head interface"). In one embodiment, the PCB interface comprises a plurality of bump contacts 110 (e.g., solder balls). The bump contacts 110 may be formed into an array, such as a ball grid array (BGA). The bump contacts 110 are reflowed to form an electrical and mechanical bond to corresponding lands 112 formed on the PCB 102. Those skilled in the art will appreciate that the interposing substrate 104 may be electrically and mechanically connected to the PCB 102 using other types of interfaces known in the art. For example, the PCB interface of the interposing substrate 104 may comprise a land grid array (LGA). That is, instead of bump contacts 110 as shown, the interposing substrate 104 may include a plurality of lands that are soldered to the lands 112.

The interposing substrate 104 may comprise a multi-layer ceramic (MLC), multi-layer organic (MLO), or like type interconnection substrate known in the art. The interposing substrate 104 is configured to route electrical signals between the probe head 106 and the PCB 102. Generally, the probe head interface of the interposing substrate 104 includes die pads 114 arranged into a plurality of die patterns. A "die pattern" is a configuration of die pads (e.g., conductive pads or lands) disposed on probe head interface of the interposing substrate 104. As discussed below, a given die pattern on the substrate 104 corresponds to a pattern of probe pins of the probe head 106, which in turn correspond to a pattern of die pads on an integrated circuit under test. Since the probe card 100 is configured to test multiple integrated circuits, the probe head interface of the interposing substrate 104 includes multiple die patterns corresponding to multiple patterns of probe pins. Moreover, as discussed below, the die patterns of the probe head interface are arranged to correspond to different probe pin configurations of multiple probe heads.

The probe head 106 includes a plurality of probe pins 116. The probe pins 116 comprise resilient contact structures configured to make contact with the die pads 114 of the interposing substrate 104. The probe head 106 is not permanently mounted (e.g., soldered) to the interposing substrate 104, allowing the probe head 106 to be easily removed. The probe pins 116 are arranged into probe pin patterns that correspond to respective die patterns on the interposing substrate 104. The collection of probe pin patterns of the probe head 106 is referred to as a probe pin configuration.

Figure 2:
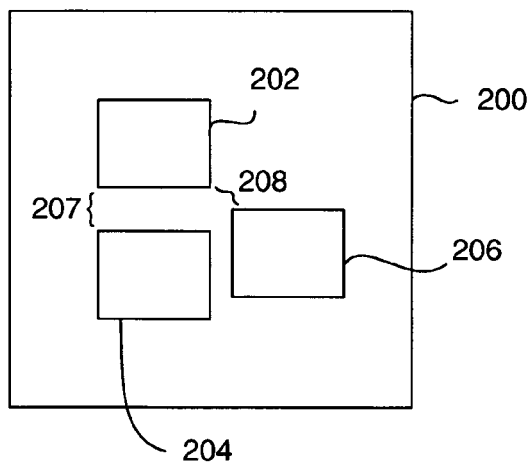
FIG. 2 is a plan view of an exemplary embodiment showing a probe head interface for an interposing substrate in accordance with one or more aspects of the invention.
Figure 5:
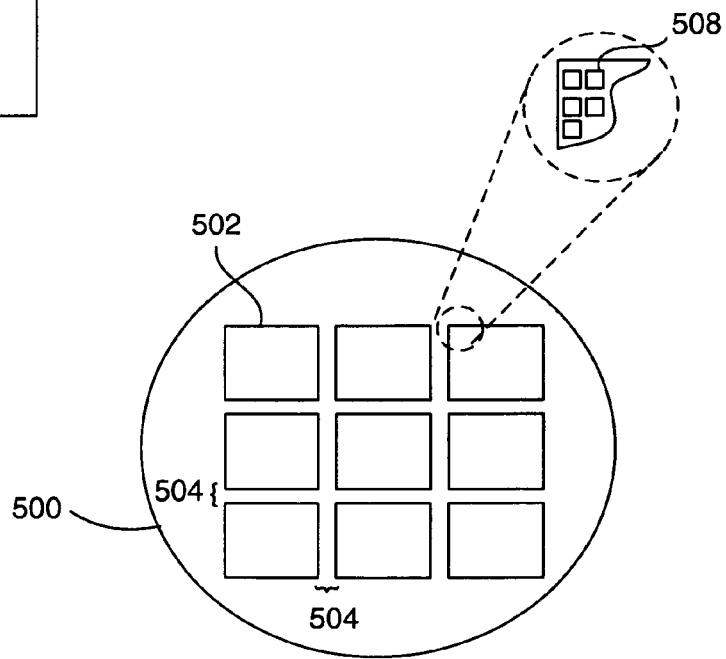
FIG. 5 is a plan view of a substrate having integrated circuit dice in accordance with one or more aspects of the invention.
Figure 3:
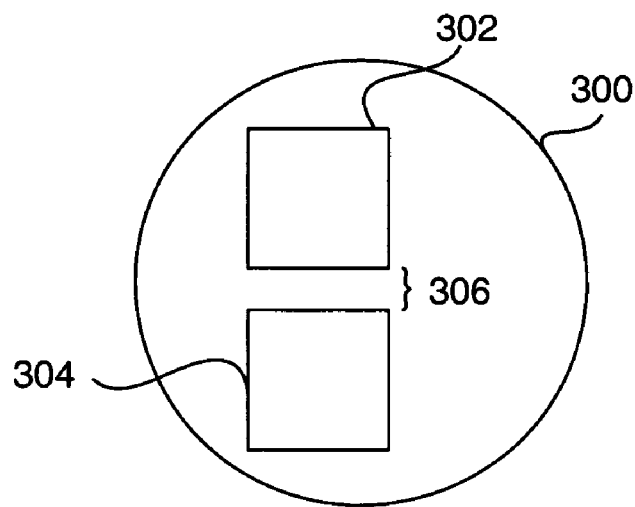
FIG. 3 is a plan view of an exemplary embodiment of a probe pin configuration for a probe head in accordance with one or more aspects of the invention.
Figure 4:
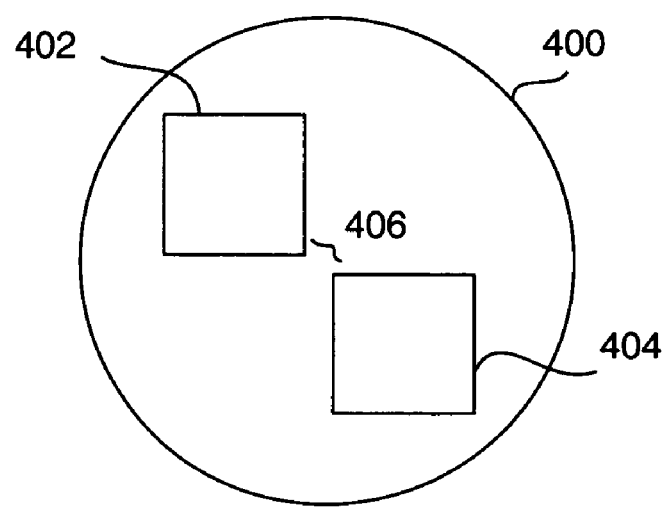
FIG. 4 is a plan view of another exemplary embodiment of a probe pin configuration for a probe head in accordance with one or more aspects of the invention.

FIG. 2 is a plan view of an exemplary embodiment showing a probe head interface 200 for the interposing substrate 104 in accordance with one or more aspects of the invention. FIG. 3 is a plan view of an exemplary embodiment of a probe pin configuration 300 for the probe head 106 in accordance with one or more aspects of the invention. FIG. 4 is a plan view of another exemplary embodiment of a probe pin configuration 400 for the probe head 106 in accordance with one or more aspects of the invention. FIG. 5 is a plan view of a substrate 500 having integrated circuit dice in accordance with one or more aspects of the invention.

As shown in FIG. 5, the substrate 500 includes a plurality of integrated circuit dice 502 (e.g., nine are shown). For example, the substrate 500 may be a wafer or panel having a multiplicity of integrated circuit dice. The distance between individual ones of the integrated circuit dice 502 is referred to as "scribe width," which is denoted by reference 504. As is well known in the art, the scribe width 504 allows the integrated circuit dice 502 to be scribed and diced into individual integrated circuits. Each of the integrated circuit dice 502 includes a plurality of die pads 508, which comprise the power and signal input/output (I/O) connections for the integrated circuit. Although the substrate 500 is illustrated as being generally circular in shape with a major flat edge, the substrate 500 may have a different shape as is conventionally known in the art.

As discussed above, the scribe width 504 of the substrate 500 may vary across different foundries. In one embodiment, the probe pin configuration 300 of FIG. 3 is configured to test the substrate 500 where the scribe width 504 is a first value (used by Foundry A), and the probe pin configuration 400 of FIG. 4 is configured to test the substrate 500 where the scribe width 504 is a second value (used by Foundry B) different from the first value.

As shown in FIG. 3, the probe pin configuration 300 includes probe pin patterns 302 and 304. Each of the probe pin patterns 302 and 304 include a plurality of probe pins (a portion thereof being shown in FIG. 1 as probe pins 116). The probe pins in each of the probe pin patterns 302 and 304 are arranged to correspond to the die pads 508 of an integrated circuit die 502 on the substrate 500. The probe pin patterns 302 and 304 are separated by a distance 306, which is equal to the scribe width 504 having a first value used by Foundry A. As shown, the probe pin patterns 302 and 304 are in a top-bottom configuration. That is, the probe pin configuration 300 is configured to test a pair of adjacent integrated circuit dice 502 in the same column on the substrate 500.

As shown in FIG. 4, the probe pin configuration 400 includes probe pin patterns 402 and 404. Each of the probe pin patterns 402 and 404 include a plurality of probe pins (portion thereof shown in FIG. 1 as probe pins 116). The probe pins in each of the probe pin patterns 402 and 404 are arranged to correspond to the die pads 508 of an integrated circuit die 502 on the substrate 500. The probe pin patterns 402 and 404 are separated by a distance 406, which is equal to the scribe width 504 having a second value from Foundry B. As shown, the probe pin patterns 402 and 404 are in a diagonal configuration. That is, the probe pin configuration 300 is configured to test a pair of adjacent integrated circuit dice 502, where the dice are in different columns and rows.

As shown in FIG. 2, the probe head interface 200 is configured to interface with each of the probe pin configuration 300 and the probe pin configuration 400. The probe head interface 200 includes a die pattern 202, a die pattern 204, and a die pattern 206. Each of the die patterns 202, 204, and 206 comprise a plurality of die pads (portion thereof shown in FIG. 1 as die pads 114). The die patterns 202 and 204 are separated by a distance 207 equal to the distance 306, which are both equal to the scribe width 504 having the first value used by Foundry A. The die pads of the die patterns 202 and 204 are arranged to correspond to the probe pins of the probe pin patterns 302 and 304, respectively.

The die patterns 202 and 206 are separated by a distance 208 equal to the distance 406, which are both equal to the scribe width 504 having the second value used by Foundry B. The die pads of the die patterns 202 and 204 are arranged to correspond to the probe pins of the probe pin patterns 402 and 404, respectively. Thus, an interposing substrate 104 having the probe head interface 200 is capable of being coupled to a probe head 106 having either the probe pin configuration 300 or the probe pin configuration 400. In one embodiment, the die pattern 202 is a guide pattern for each probe tip configuration 300 and 400 (i.e., the die pattern 202 is used in each configuration).

By configuring the interposing substrate 104 with the probe head interface 200, the probe card 100 is capable of using probe heads having different probe pin configurations, i.e., the probe pin configurations 300 and 400. In this manner, a single common interposing substrate can be designed for use with two different dual-site probe heads. A probe card for Foundry A includes a generic PCB, common interposing substrate for a particular integrated circuit device, and a probe head having the top-bottom probe pin configuration (configuration 300). A probe card for Foundry B includes the generic PCB, the common interposing substrate, and a probe head having the diagonal probe pin configuration (configuration 400).

The embodiments of FIGS. 2 through 4 are shown by way of example only. It is to be understood that the interposing substrate 104 may be configured with a probe head interface having a plurality of die patterns that are arranged in a plurality of probe pin configurations. Thus, an interposing substrate 104 may be configured to work generally with a plurality of probe heads, each having a different probe pin configuration. Although a probe card configured for top-and-bottom and diagonal configurations has been described, those skilled in the art will appreciate that other dual configuration probe cards may be provided in accordance with the invention. For example, a probe card may be configured for a top-and-bottom configuration and a left-and-right configuration.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Trademarks are the property of their respective owners.

What is claimed is:

1. An apparatus, comprising:
a probe card circuit board; and a substrate having a first interface coupled to the probe card circuit board and a second interface having a plurality of die patterns respectively corresponding to die patterns of a plurality of integrated circuits (ICs) under test, the plurality of die patterns being arranged with respect to the substrate in a plurality of probe pin configurations, the plurality of die patterns including separations of a first scribe width and a second scribe width, the first scribe width being different from the second scribe width, wherein a first pair of die patterns of the second interface having the separation of the first scribe width corresponds to a pair of probe pin configurations of a first probe head for testing a pair of ICs on a first wafer from a first foundry, and a second pair of die patterns of the second interface having the separation of the second scribe width corresponds to a pair of probe pin configurations of a second probe head for testing a pair of ICs on a second wafer from a second foundry.

2. The apparatus of claim 1, wherein the plurality of die patterns includes a first die pattern, a second die pattern, and a third die pattern, and wherein the plurality of probe pin configurations includes a first probe pin configuration and a second probe pin configuration, the first probe pin configuration comprising probe pins corresponding to the first die pattern and the second die pattern, and the second probe pin configuration comprising probe pins corresponding to the first die pattern and the third die pattern; and wherein the first pair of die patterns includes the first and second die patterns, and the second pair of die patterns includes the first and third die patterns.

3. The apparatus of claim 2, wherein the first die pattern and the second die pattern are separated by the first scribe width, wherein the first die pattern and the third die pattern are separated by the second scribe width, and wherein the first scribe width is different from that of the second scribe width.

4. The apparatus of claim 2, wherein the first die pattern and the second die pattern are arranged in a top-and-bottom configuration, and wherein the first die pattern and the third die pattern are arranged in a diagonal configuration or a left-and-right configuration.

5. The apparatus of claim 2, wherein the first die pattern is a guide pattern for each of the first probe pin configuration and the second probe pin configuration.

6. The apparatus of claim 1, wherein each of the plurality of die patterns comprises a plurality of die pads configured to interface with a respective plurality of probe pins.

7. The apparatus of claim 1, wherein the first interface comprises a plurality of bump contacts, wherein the probe card circuit board comprises a plurality of lands, and wherein the plurality of bump contacts are soldered to the plurality of lands.

8. A probe card for use with a plurality of probe heads, comprising:

a printed circuit board;

a substrate having a first interface coupled to the printed circuit board and a second interface having a plurality of die patterns respectively corresponding to die patterns of a plurality of integrated circuits (ICs) under test, the plurality of die patterns being arranged with respect to the substrate to correspond to probe pin patterns of the plurality of probe heads, the plurality of die patterns including separations of a first scribe width and a second scribe width, the first scribe width being different from the second scribe width;

wherein a first pair of die patterns of the second interface having the separation of the first scribe width corresponds to a pair of probe pin configurations of a first of the plurality of probe heads for testing a pair of ICs on a first wafer from a first foundry; and a second pair of die patterns of the second interface having the separation of the second scribe width corresponds to a pair of probe pin configurations of a second of the plurality of probe heads for testing a pair of ICs on a second wafer from a second foundry.

9. The probe card of claim 8, wherein the plurality of die patterns includes a first die pattern, a second die pattern, and a third die pattern, wherein the plurality of probe heads includes a first probe head and a second probe head, wherein the first probe head includes first probe pin patterns matching the first die pattern and the second die pattern, and wherein the second probe head includes second probe pin patterns matching the first die pattern and the third die pattern; and wherein the first pair of die patterns includes the first and second die patterns, and the second pair of die patterns includes the first and third die patterns.

10. The probe card of claim 9, wherein the first die pattern and the second die pattern are separated by the first scribe width, wherein the first die pattern and the third die pattern are separated by the second scribe width, and wherein the first scribe width is different from that of the second scribe width.

11. The probe card of claim 10, wherein the first die pattern and the second die pattern are arranged in a top-and-bottom configuration, and wherein the first die pattern and the third die pattern are arranged in a diagonal configuration or a left-and-right configuration.

12. The probe card of claim 8, wherein the first die pattern is a guide pattern for the probe pin patterns of the plurality of probe heads.

13. The probe card of claim 8, wherein each of the plurality of die patterns comprises a plurality of die pads configured to interface with a respective plurality of probe pins.

14. The probe card of claim 8, wherein the first interface comprises a plurality of bump contacts, wherein the printed circuit board comprises a plurality of lands, and wherein the plurality of bump contacts are soldered to the plurality of lands.

15. A probe card for use with a first probe head and a second probe head, comprising:

a printed circuit board; and a substrate having a first interface coupled to the printed circuit board and a second interface having a first die pattern, a second die pattern, and a third die pattern, the first die pattern and the second die pattern being arranged with respect to the substrate to correspond to probe pin patterns of the first probe head, the first die pattern and the third die pattern being arranged with respect to the substrate to correspond to probe pin patterns of the second probe head, the first die pattern and the second die pattern being separated by a first scribe width, the first die pattern and the third die pattern being separated by a second scribe width, the first scribe width being different from the second scribe width, wherein the probe pin patterns of the first probe head correspond to first and second integrated circuits (ICs) on a first wafer from a first foundry, and the probe pin patterns of the second probe head correspond to third and fourth ICs on a second wafer from a second foundry.

16. The probe card of claim 15, wherein the first die pattern and the second die pattern are arranged in a top-and-bottom configuration and wherein the first die pattern and the third die pattern are arranged in a diagonal configuration or a left-and-right configuration.

17. The probe card of claim 15, wherein the first die pattern is a guide pattern for the first probe head and the second probe head.

18. The probe card of claim 15, wherein each of the first die pattern, the second die pattern, and the third die pattern comprises a plurality of die pads configured to interface with a respective plurality of probe pins.

19. The probe card of claim 15, wherein the first interface comprises a plurality of bump contacts, wherein the printed circuit board comprises a plurality of lands, and wherein the plurality of bump contacts are soldered to the plurality of lands.

\* \* \* \* \*